(12) United States Patent
Marin et al.

(10) Patent No.: US 11,728,265 B2
(45) Date of Patent: Aug. 15, 2023

(54) SELECTIVE DEPOSITION OF EMBEDDED THIN-FILM RESISTORS FOR SEMICONDUCTOR PACKAGING

(71) Applicant: Intel Corporation, Santa Clara, CA (US)

(72) Inventors: Brandon C. Marin, Chandler, AZ (US); Frank Truong, Gilbert, AZ (US); Shivasubramanian Balasubramanian, Gilbert, AZ (US); Dilan Seneviratne, Chandler, AZ (US); Yonggang Li, Chandler, AZ (US); Sameer Paital, Chandler, AZ (US); Darko Grujicic, Chandler, AZ (US); Rengarajan Shanmugam, Chandler, AZ (US); Melissa Wette, East Palo Alto, CA (US); Srinivas Pietambaram, Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 1056 days.

(21) Appl. No.: 16/129,711

(22) Filed: Sep. 12, 2018

(65) Prior Publication Data

US 2020/0083164 A1 Mar. 12, 2020

(51) Int. Cl.
*H01L 23/498* (2006.01)
*H01L 21/48* (2006.01)
(Continued)

(52) U.S. Cl.
CPC ...... *H01L 23/5228* (2013.01); *H01L 21/4846* (2013.01); *H01L 21/76871* (2013.01);
(Continued)

(58) Field of Classification Search
CPC .............................. H01L 23/647; H05K 1/167
See application file for complete search history.

(56) References Cited

U.S. PATENT DOCUMENTS

| 6,987,661 | B1 * | 1/2006 | Huemoeller | ............ | H01L 25/16 |
| | | | | | 361/312 |
| 7,049,929 | B1 * | 5/2006 | Fjelstad | ................. | H01C 7/005 |
| | | | | | 338/311 |

(Continued)

FOREIGN PATENT DOCUMENTS

JP 2008187018 A * 8/2008
KR 20120015397 A * 2/2012

*Primary Examiner* — Daniel Luke
(74) *Attorney, Agent, or Firm* — Schwabe, Williamson & Wyatt P.C.

(57) ABSTRACT

Embodiments include package substrates and a method of forming the package substrates. A package substrate includes a dielectric having a cavity that has a footprint, a resistor embedded in the cavity of the dielectric, and a plurality of traces on the resistor, where a plurality of surfaces of the resistor are activated surfaces. The resistor may also have a plurality of sidewalls which may be activated sidewalls and tapered. The dielectric may include metallization particles/ions. The resistor may include resistive materials, such as nickel-phosphorus (NiP), aluminum-nitride (AlN), and/or titanium-nitride (TiN). The package substrate may further include a first resistor embedded adjacently to the resistor. The first resistor may have a first footprint of a first cavity that is different than the footprint of the cavity of the resistor. The resistor may have a resistance value that is thus different than a first resistance value of the first resistor.

15 Claims, 6 Drawing Sheets

(51) Int. Cl.
*H01L 23/522* (2006.01)
*H01L 49/02* (2006.01)
*H01L 21/768* (2006.01)
*H01L 23/00* (2006.01)
*H01L 27/01* (2006.01)
*H01L 23/64* (2006.01)

(52) U.S. Cl.
CPC ........ *H01L 23/498* (2013.01); *H01L 23/5226* (2013.01); *H01L 23/647* (2013.01); *H01L 24/09* (2013.01); *H01L 27/016* (2013.01); *H01L 28/24* (2013.01)

(56) References Cited

U.S. PATENT DOCUMENTS

| | | | | |
|---|---|---|---|---|
| 7,277,005 B2 * | 10/2007 | Kang | ................ | H01C 17/0652 338/249 |
| 7,494,889 B2 * | 2/2009 | Lee | ................ | H05K 1/162 438/238 |
| 2007/0124918 A1 * | 6/2007 | Su | ................ | H01C 7/006 29/610.1 |

* cited by examiner

SELECTIVE DEPOSITION OF EMBEDDED THIN-FILM RESISTORS FOR SEMICONDUCTOR PACKAGING

FIELD

Embodiments relate to packaging semiconductor devices. More particularly, the embodiments relate to semiconductor devices that include embedded thin-film resistors.

BACKGROUND

For the past several decades, the scaling of features in integrated circuits has been a driving force behind an ever-growing semiconductor industry. Scaling to smaller and smaller features enables increased densities of functional units on the limited real estate of semiconductor devices. For example, shrinking transistor size allows for the incorporation of an increased number of memory devices on a chip, lending to the fabrication of products with increased capacity. The drive for ever-more capacity, however, is not without issue. The necessity to optimize the performance of each device becomes increasingly significant.

Semiconductor devices typically utilize resistors for voltage power regulation. In particular, thin-film resistors are needed in semiconductor devices due to the added functionality and the reduced form factor implemented in the device. Resistors can be pre-assembled and then added to a device. Alternatively, existing technologies may use a dry deposit to form resistors into layers of a device using lithography and subtractive etching.

Pre-assembled resistors, however, have a large form factor and limit the available space of the device which may be used for routing and other functionalities. Meanwhile, deposited resistors rely on lithography to define the geometry of the resistors which is generally complex, time-consuming and expensive.

BRIEF DESCRIPTION OF THE DRAWINGS

Embodiments described herein illustrated by way of example and not limitation in the figures of the accompanying drawings, in which like references indicate similar features. Furthermore, some conventional details have been omitted so as not to obscure from the inventive concepts described herein.

DETAILED DESCRIPTION

Described herein are semiconductor packages that include embedded thin-film resistors and methods of forming such semiconductor packages. The semiconductor package described below and methods of forming such semiconductor package includes one or more embodiments that selectively deposit embedded thin-film resistors (e.g., a nickel phosphorus (NiP) resistor) in a package substrate while building up layers, and geometrically define the embedded thin-film resistors—and thus defining the desired resistance of such resistors. Additionally, these semiconductor packages include embedded thin-film resistors that enable improved voltage power, added functionality, and reduced form factor—which also facilitates overall cost-reduction and efficiency.

Figure 1A:
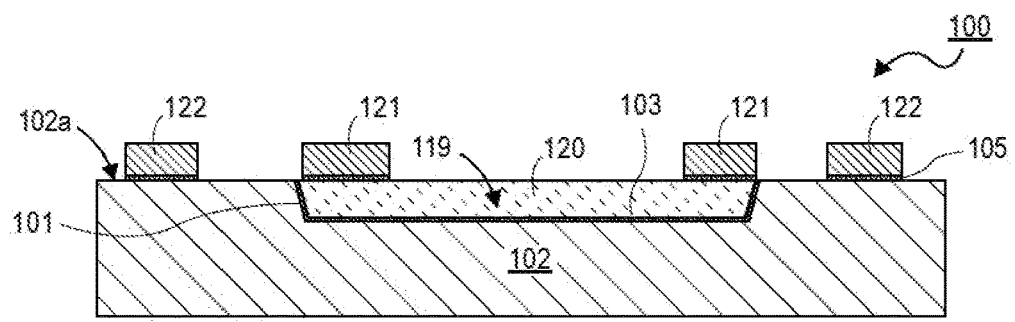
FIG. 1A is an illustration of a cross-sectional view of a package substrate having an embedded resistor in a dielectric that includes a cavity and an activated layer, according to one embodiment.

According to some embodiments, a package substrate is described (e.g., the package substrate 100 shown in FIG. 1A). For one embodiment, the package substrate includes a dielectric (or a dielectric layer) that is patterned to form a cavity. The cavity may be patterned to have a desired/specified footprint. As used herein, a "footprint" refers to an area in the x-y dimensions where a resistance value of a resistor may be defined by the geometry (or footprint) of the resistor. For example, a resistance value of an embedded resistor can be increased/decreased by changing the parameters defining the geometry of the resistor as a deeper/longer channel equates to a larger volume resistor and hence a larger resistance value, while a shallower/shorter channel equates to a smaller volume resistor and hence a smaller resistance value.

Figure 1B:
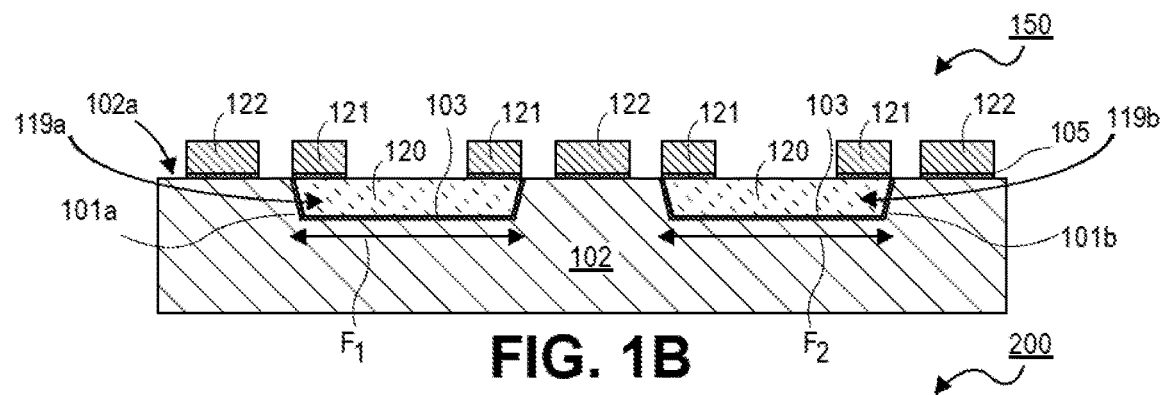
FIG. 1B is an illustration of a cross-sectional view of a package substrate having one or more embedded resistors having different footprints in a dielectric that includes one or more cavities and one or more activated layers, according to one embodiment.

In one embodiment, the package substrate also includes a resistor disposed and embedded in the cavity of the dielectric. The resistor may have a top surface that is exposed and one or more surfaces that may be embedded in the cavity. For some embodiments, the package substrate further includes one or more traces (or addressing traces) disposed on the resistor. As used herein, an "addressing trace" (also includes an "addressing via" and/or an "addressing via pad") refers to a conductive material such as a conductive trace/via/via pad, which may be directly disposed on a resistive material of the embedded resistor, and thus electrically coupled to the embedded resistor to form an input/output terminal for the electrical resistance of the embedded resistor. According to some embodiments, the one or more surfaces of the resistor (e.g., the embedded surfaces within the cavity) may be activated surfaces (e.g., the activated layer/surfaces 103 as shown in FIG. 1A and FIG. 1B).

As used herein, an "activated surface" (also referred to as an "activated layer") refers to a surface in a dielectric or the like where the dielectric has been doped with a chemical component (e.g., palladium (Pd)). Accordingly, the "activated surface" includes the chemical compound which may be activated by, for example, exposure to a light source or a chemical treatment (or a chemical solution). As a result of the exposure, the "activated surface" includes the chemical compound which has a first state, while the chemical compound remaining in the dielectric has a second state (or a different oxidation state as compared to the activated chemical compound). For example, in one embodiment, the activated surface may include Pd which has a state of $Pd^0$ (and hence catalytically active for electroless deposition) as the remaining Pd (or the remaining Pd in the bulk) in the dielectric has a different oxidation state of $Pd^{2+}$.

In additional embodiments, the resistor has one or more sidewalls which are also activated sidewalls. For one embodiment, the package substrate may include that the one or more sidewalls are tapered. According to some embodiments, the package substrate may have one or more routing traces disposed on the dielectric, where the routing traces are located/positioned adjacent to the traces on the embedded resistor. Furthermore, the package substrate may also include a first resistor that is disposed and embedded in a first cavity of the dielectric. For example, the dielectric may be patterned to form the first cavity (or an additional cavity) which may be formed on the same plane (or surface) as the cavity (e.g., as shown in FIG. 1B). The first cavity may also be patterned to have a first footprint (or any desired/specified footprint).

Accordingly, in some embodiments, the package substrate may dispose and embed the first resistor in the first cavity, where the first resistor may have a top first surface that is exposed and one or more first surfaces that may be embedded in the first cavity. For some embodiments, the package substrate further includes one or more first traces (or one or more first addressing traces) disposed on the first resistor. In some embodiments, the package substrate has the cavity and the first cavity (e.g., as shown in FIG. 1B) where the first cavity has a first footprint that is different than the footprint of the cavity. In these embodiments, the resistor may have a resistance value that is different than a first resistance value of the first resistor based on the differing footprints of the resistors. Additionally, for some embodiments, the package substrate may include a seed layer that is disposed between the traces and the top surface of the resistor (and/or the first resistor), and between the routing traces and the dielectric.

Embodiments of the package substrate improved packaging solutions by forming embedded thin resistors having one or more resistance value in a dielectric which has one or more activated surfaces coupled to such resistors. Additionally, these embodiments enable controlling and defining the geometry of the resistors and the activated surfaces of the cavities which provide complete control over the resistance values of these embedded resistors. These thin-film embedded resistors may be patterned in parallel with copper traces within the same layer, thus allowing efficient parallel fabrication of passive features. Accordingly, the embodiments described herein improve resistors and/or any other passive components by forming and embedding thin-film resistors within a build-up layer with activated surfaces, which exponentially (i) add functionality to the package substrate and (ii) reduce the overall process flow cost by eliminating the need of lithography or wet methods of electroless catalyst activation. Additionally, another advantage of the embodiments of the package substrate is including a sputtered seed layer (e.g., titanium (Ti)) disposed between the traces and/or vias, which mitigates any concern of the resistive material (e.g., NiP) of the embedded resistor to migrate from the resistor and into the copper of the traces and/or vias. Essentially, the seed layer acts as a diffusion barrier between the resistor and the electrically addressing architecture.

The technologies described herein may be implemented in one or more electronic devices. Non-limiting examples of electronic devices that may utilize the technologies described herein include any kind of mobile device and/or stationary device, such as microelectromechanical systems (MEMS) based electrical systems, gyroscopes, advanced driving assistance systems (ADAS), 5G communication systems, cameras, cell phones, computer terminals, desktop computers, electronic readers, facsimile machines, kiosks, netbook computers, notebook computers, internet devices, payment terminals, personal digital assistants, media players and/or recorders, servers (e.g., blade server, rack mount server, combinations thereof, etc.), set-top boxes, smart phones, tablet personal computers, ultra-mobile personal computers, wired telephones, combinations thereof, and the like. Such devices may be portable or stationary. In some embodiments, the technologies described herein may be employed in a desktop computer, laptop computer, smart phone, tablet computer, netbook computer, notebook computer, personal digital assistant, server, combinations thereof, and the like. More generally, the technologies described herein may be employed in any of a variety of electronic devices, including package substrates having embedded resistors in dielectrics that include cavities and activated layers.

In the following description, various aspects of the illustrative implementations will be described using terms commonly employed by those skilled in the art to convey the substance of their work to others skilled in the art. However, it will be apparent to those skilled in the art that the present embodiments may be practiced with only some of the described aspects. For purposes of explanation, specific numbers, materials and configurations are set forth in order to provide a thorough understanding of the illustrative implementations. However, it will be apparent to one skilled in the art that the present embodiments may be practiced without the specific details. In other instances, well-known features are omitted or simplified in order not to obscure the illustrative implementations.

Various operations will be described as multiple discrete operations, in turn, in a manner that is most helpful in understanding the present embodiments, however, the order of description should not be construed to imply that these operations are necessarily order dependent. In particular, these operations need not be performed in the order of presentation.

As used herein the terms "top," "bottom," "upper," "lower," "lowermost," and "uppermost" when used in relationship to one or more elements are intended to convey a relative rather than absolute physical configuration. Thus, an element described as an "uppermost element" or a "top element" in a device may instead form the "lowermost element" or "bottom element" in the device when the device is inverted. Similarly, an element described as the "lowermost element" or "bottom element" in the device may instead form the "uppermost element" or "top element" in the device when the device is inverted.

FIG. 1A is an illustration of a cross-sectional view of a package substrate 100 having an embedded resistor 101 (or the resistor) in a dielectric 102 that includes a cavity 119 and an activated layer 103, according to one embodiment.

Figure 4:
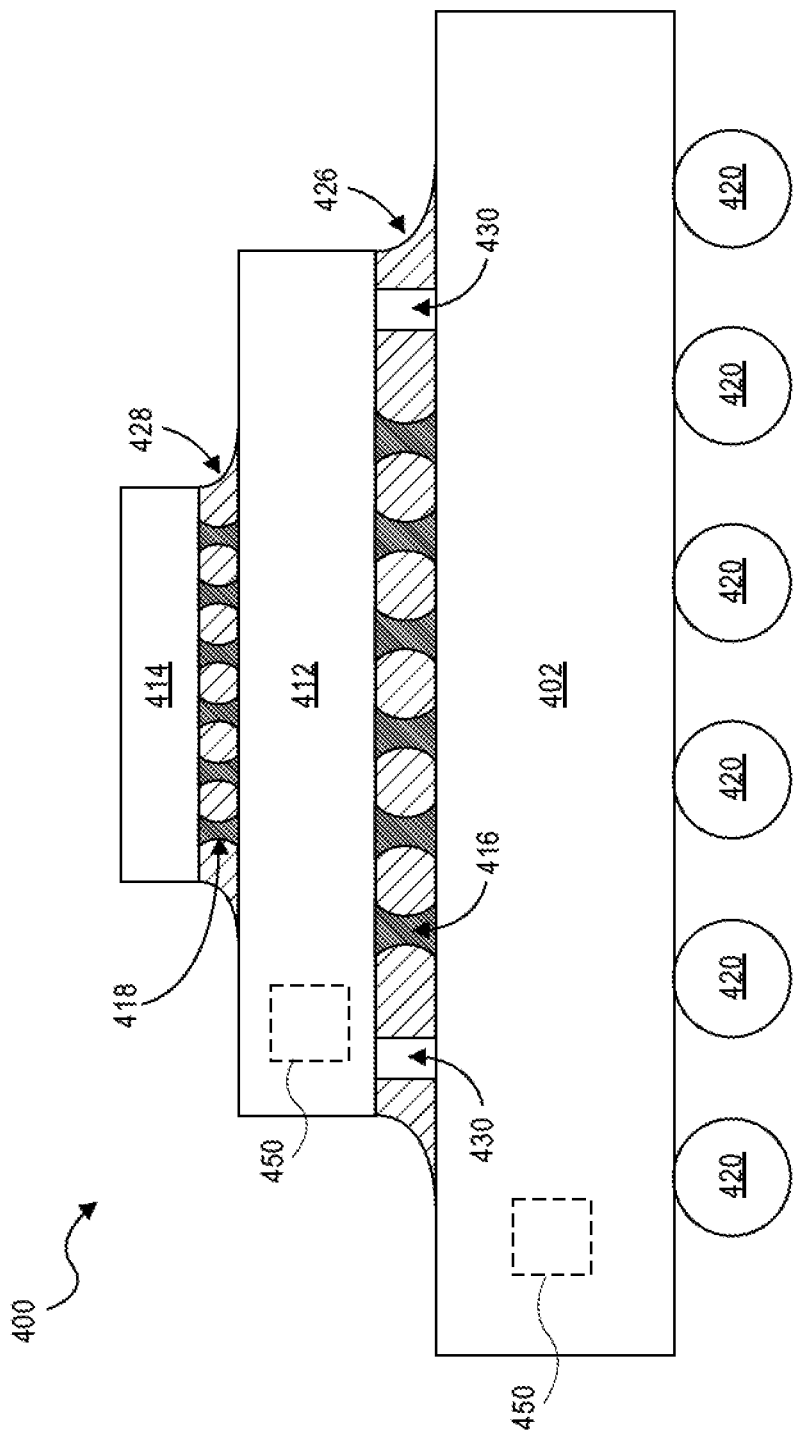
FIG. 4 is an illustration of a cross-sectional view of a semiconductor packaged system including a die, a substrate, a package substrate, and one or more embedded resistors, according to one embodiment.

For some embodiments, the package substrate 100 includes an activated layer 103 disposed on the one or more surfaces of the cavity 119, a resistor 101 embedded within the cavity 119 of the dielectric 102, a plurality of traces 121 (also referred to as a plurality of addressing traces) disposed on the resistor 101, and a plurality of routing traces 122 disposed on the dielectric 102. In additional embodiments, the package substrate 100 may be included in a semiconductor package (e.g., the semiconductor package 400 as shown in FIG. 4), where the semiconductor package may include the package substrate (e.g., the package substrate 100) and one or more additional substrates, dies, interposers, etc., that are stacked/coupled to form the semiconductor package.

According to some embodiments, the package substrate 100 may include, but is not limited to, a substrate, a printed circuit board (PCB), and a motherboard. For one embodiment, the package substrate 100 is a PCB. For one embodiment, the PCB is made of an FR-4 glass epoxy base with thin copper foil laminated on both sides. For certain embodiments, a multilayer PCB can be used, with pre-preg and copper foil used to make additional layers. For example, the multilayer PCB may include one or more dielectrics (e.g., the dielectric 102 of FIGS. 1A-1B, and/or the dielectrics 302 and 304 of FIG. 3F), where each dielectric layer can be a photosensitive dielectric layer. For some embodiments, holes may be drilled in the PCB 100. For one embodiment, the PCB 100 may also include one or more conductive layers (e.g., copper (Cu) or any other metallic/conductive material) that are used to form traces (e.g., the traces 121, the routing traces 122), vias (e.g., the addressing vias 340 of FIG. 3F), pads, planes, and/or the like.

In some embodiments, the dielectric 102 may be a polymer material such as, for example, polyimide, epoxy, or build-up film (BF). For one embodiment, the dielectric 102 may be an ajinomoto build-up film (ABF). In an embodiment, the dielectric 102 may be one layer in a stack of layers that includes a plurality of additional dielectrics used to form a build-up structure. As such, by way of example, the dielectric 102 may be formed over another dielectric. Additional embodiments may include disposing (or laminating) the dielectric 102 as a base dielectric over a core material (e.g., a glass carrier or the like) on which the stack is formed. According to an additional embodiment, the dielectric 102 may be the bottommost layer of the package substrate 100 and may include, but is not limited to, a metallic material, an adhesive layer/film/tape, or any other core material.

The dielectric 102 may also include any appropriate dielectric material such as, but not limited to, an epoxy-polymer, a combination of epoxy-polymer materials, a silicon dioxide (SiO$_2$), and a silicon nitride. Additionally, the dielectric 102 may include a low-k dielectric and/or an ultra-low-k dielectric having, but not limited to, one or more carbon doped dielectrics, fluorine doped dielectrics, porous dielectrics, organic polymeric dielectrics, silicon based polymeric dielectrics, and/or the like. As used herein, a "low-k dielectric" refers to a material having a lower dielectric constant (k) than silicon oxide. For example, the dielectric 102 may be formed using dielectric materials having low-k dielectric materials. Examples of such dielectric materials that may be used include, but are not limited to, SiO$_2$, carbon doped oxide (CDO), silicon nitride, organic polymers such as perfluorocyclobutane or polytetrafluoroethylene, fluorosilicate glass (FSG), and/or organosilicates, such as silsesquioxane, siloxane, or organosilicate glass.

As shown in FIG. 1A, the dielectric 102 has a top surface 102a that may be patterned to form the cavity 119 and then subsequently form the resistor 101 (as described in further detail below in FIGS. 2A-2G). For some embodiment, the dielectric 102 may include a plurality of metallization particles (also referred to as metallization components, dopants, and/or ions) dispersed thereof. In one embodiment, the metallization particles may be any appropriate material which may subsequently initiate, for example, an activation layer and/or a deposition of a conductive layer by an electroless process. The metallization particles (or dopants) may include one or more materials including, but not limited to, palladium salts (e.g., palladium acetate, palladium bis-triphenylphosphine, and/or the like), silver salts, copper salts, platinum salts, nickel salts, and/or the like. Additionally, the dielectric 102 may be doped (or include) with the metallization particles such as Pd, while in other embodiments, the dielectric 102 may be doped with gold, silver, platinum, ruthenium, and/or a combination thereof. For some embodiments, the dielectric 102 may be formed by any process known in the art, including, but not limited to, doping, co-deposition, and the like.

In some embodiments, the cavity 119 may be patterned to have a desired/specified footprint. As such, the cavity 119 may have a footprint with a defined length and a defined depth to establish a defined resistance value for a subsequently formed, embedded resistor (e.g., the resistor 101). In one embodiment, the defined length of the cavity 119 may be approximately between 5 μm to 150 μm. In other embodiments, the defined length of the cavity 119 may be approximately 5 μm or less. Additionally, in some embodiments, the defined depth of the cavity 119 may be approximately between 5 μm to 80 μm. In other embodiments, the defined depth of the cavity 119 may be approximately 5 μm or less. Accordingly, the package substrate 100 may thus increase and/or decrease the resistance value of the resistor 101 by changing the defined length and the defined depth of the resistor 101, where (i) a deeper/longer cavity equates to a larger volume resistor and hence a larger resistance value, and (ii) a shallower/shorter cavity equates to a smaller volume resistor and hence a smaller resistance value.

For some embodiments, the package substrate 100 also includes the resistor 101 which is disposed and embedded in the cavity 119 of the dielectric 102. In some embodiments, the resistor 101 may include one or more resistive materials 120, including, but not limited to, NiP, aluminum-nitride (AlN), titanium-nitride (TiN), a combination thereof, and/or the like. For example, the resistor 101 may be an embedded resistor including, but not limited to, a NiP embedded resistor, an AlN embedded resistor, and/or a TiN embedded resistor. As such, the one or more resistive materials 120 may be selected from the group consisting of NiP, AlN, TiN, a combination thereof, or the like. In some embodiments, the resistive material 120 of the resistor 101 may be formed using an electroless deposition process or the like.

Additionally, the resistor 101 may include, but is not limited to, one or more resistive materials 120, including nickel, phosphorous, aluminum, nitrogen, titanium, and/or one or more base metals having elements from Groups IIIA-VIIA and IIIB-VIIB of the periodic table such as zirconium, vanadium, niobium, chromium, hafnium, tantalum, tungsten, and/or molybdenum. Furthermore, the resistor 101 may be formed to have a specific concentration of each component (or resistive material 120) that is controlled to achieve a desired resistivity and a desired electronic and thermal stability for the resistor 101. In some embodiments, the resistivity of the resistor 101 may include a resistivity value approximately between 0.1 Ohm-centimeter to 40 Ohm-centimeter. Note, that in some embodiments, the embedded resistor 101 may be formed with the deposition of any resistive material, where such deposition process may include an electroless plating process or the like (e.g., a catalytic electroless process). Also note, that in at least one embodiment, the resistor 101 may be formed of an amorphous material, where the amorphous material may be used to remain amorphous even when subjected to typical annealing conditions.

Moreover, as illustrated in FIG. 1A, the resistor 101 may have a top surface that may be exposed (or have one or more exposed surfaces on the top surface), and one or more surfaces (or sidewalls/edge walls) that may be embedded in the cavity 119. For example, the resistor 101 may include a resistive material(s) 120 having a surface(s) that are exposed. Additionally, according to some embodiments, the one or more surfaces of the resistor 101 may be one or more activated surfaces (i.e., the one or more surfaces of the resistor 101 may be formed of the activated layer 103). In some embodiments, the activated layer 103 may be a surface in the dielectric 102, where the activated layer 103 may include one or more chemical compound(s) (e.g., Pd or the like) that may be activated by, for example, exposure to a light source or a chemical treatment (or a chemical solution). As such, the one or more surfaces of the resistor 101 may be embedded and thus surrounded by the activated layer 103, where the activated layer 103 may have a first state as the chemical compound remaining in the dielectric 102 may have a second state (or a different oxidation state compared to the oxidation state of the activated layer 103). For example, in one embodiment, the activated layer 103 may include Pd having a state of $Pd^0$ while the dielectric 102 may have a bulk of Pd having a different oxidation state of $Pd^{2+}$ or $Pd^{4+}$.

In additional embodiments, the one or more surfaces of the resistor 101 may be sidewalls. As such, in these embodiments, the one or more sidewalls of the resistor 101 may be activated sidewalls, where the activated sidewalls may be included in the activated layer 103. For some embodiments, the one or more sidewalls of the resistor 101 may be tapered and thus tapered sidewalls.

According to some embodiments, the package substrate 100 may have a plurality of electrically traces 121 that are disposed on the top surface of the resistor 101. The traces 121 may be disposed on the top surface of the resistor 101, where the traces 121 are positioned and located on the outer periphery of the top surface of the resistor 101 (as shown in FIG. 1A). Additionally, the package substrate 100 may also include a plurality of routing traces 122 that are disposed on the top surface of the dielectric 102, where the routing traces 122 may be positioned and located adjacent to the traces 121.

The addressing and routing traces 121-122 may include one or more conductive materials, including Cu or the like. For one embodiment, the addressing and routing traces 121-122 may be formed using an electrolytic plating process or the like. For some embodiments, the addressing and routing traces 121-122 may have a length of approximately between 2 μm to 5000 μm, and a thickness (or depth) of approximately between 5 μm to 100 μm. In alternate embodiments, however, the addressing and routing traces 121-122 may have a length of approximately between 2 μm or less, and a thickness (or depth) of approximately 5 μm or less. In one embodiment, a seed layer 105 may be disposed between the traces 121 and the top surface of the resistor 101, and disposed between the routing traces 122 and the top surface 102a of the dielectric 102. The seed layer 105 may include one or more conductive materials, such as titanium or the like. The seed layer 105 may be used to prevent the traces 121 (e.g., the Cu addressing traces) from absorbing material (e.g., by diffusive migration) from the resistive material 120 (e.g., the NiP resistive material).

Note that the package substrate 100 of FIG. 1A may include fewer or additional packaging components based on the desired packaging design.

FIG. 1B illustrates a package substrate 150 having one or more embedded resistors 101a-b having different footprints $F_1$ and $F_2$ in the dielectric 102 that includes one or more cavities 119a-b and one or more activated layers 103, according to one embodiment. The package substrate 150 may be similar to the package substrate 100 of FIG. 1A, however the package substrate 150 includes two resistors 101a-b where the resistor 101a has a footprint $F_1$ that is different than a footprint $F_2$ of the resistor 101b—and thus the resistors 101a-b have different resistive values based on the differing footprints $F_1$ and $F_2$. Additionally, note that the one or more components of the package substrate 150 are similar to the one or more components of the package substrate 100 of FIG. 1A as described above.

In some embodiments, the package substrate 150 may include a first resistor 101a that is disposed and embedded in a first cavity 119a of the dielectric 102. Additionally, the package substrate 150 also includes a second resistor 101b that is disposed and embedded in a second cavity 119b of the dielectric 102. For example, the dielectric 102 may be patterned to form the first cavity 119a which is formed on the same plane (or surface) as the second cavity 119b.

Accordingly, in some embodiments, the package substrate 150 may dispose and embed the first and second resistors 101a-b in the first and second cavities 119a-b, where the first and second resistors 101a-b may have respectively top first and second surfaces that are exposed and one or more first and second surfaces that may be embedded in the first and second cavities 101a-b. For some embodiments, the package substrate 150 further includes one or more traces 121 (also referred to as a plurality of addressing traces) that are disposed on the first and second resistors 101a-b, and one or more routing traces 122 disposed on the top surface 102a of the dielectric 102. In some embodiments, the first resistor 101a may have a first resistance value that is different than a second resistance value of the second resistor 101b based on the differing footprints $F_1$ and $F_2$ of the first and second resistors 101a-b. For example, the footprints $F_1$ and $F_2$ of the first and second resistors 101a-b may be approximately between 5 μm to 150 μm, where the footprint $F_1$ may be greater or less than the footprint $F_2$.

For some embodiments, the package substrate 150 includes the activated layer 103 disposed on the one or more surfaces of the first and second cavities 119a-b. Moreover, as illustrated in FIG. 1B, the resistors 101a-b may have top surfaces that may be exposed (or have one or more exposed surfaces on the top surfaces), and one or more surfaces (or sidewalls/edge walls) that may be embedded in the first and second cavities 119a-b. As described above, the resistors 101a-b may include one or more resistive material 120 including NiP, AlN, TiN, and/or the like.

Additionally, according to some embodiments, the one or more surfaces of the first and second resistors 101a-b may be activated surfaces (i.e., the one or more surfaces of the first and second resistors 101a-b may include the activated layer 103). In other embodiments, the one or more surfaces of the first and second resistors 101a-b may be sidewalls. As such, in these embodiments, the one or more sidewalls of the first and second resistors 101a-b may be activated sidewalls, where the activated sidewalls may be included in the activated layer 103. For some embodiments, the one or more sidewalls of the first and second resistors 101a-b may be tapered and thus tapered sidewalls.

In one embodiment, a seed layer 105 may be disposed between the traces 121 and the top surface of the resistors 101a-b, and disposed between the routing traces 122 and the top surface 102a of the dielectric 102. The seed layer 105 may include one or more conductive materials, such as titanium or the like. The seed layer 105 may be used to prevent the traces 121 (e.g., the Cu addressing traces) from absorbing material (e.g., by diffusive migration) from the resistive material 120 (e.g., the NiP resistive material).

Note that the package substrate 150 of FIG. 1B may include fewer or additional packaging components based on the desired packaging design.

FIGS. 2A-2G are illustrations of cross-sectional views of a process flow to form an embedded resistor in a package substrate 200, according to some embodiments. These embodiments as shown with respect to FIGS. 2A-2G provide the process flow that combines a patterning process and an electroless plating process to form one or more embedded resistors in a dielectric that has been patterned with one or more cavities, where the cavities include an activated layer disposed thereof. The process flow illustrated with FIGS. 2A-2G implements the formation of thin-embedded resistors (e.g., the resistor 201 of FIG. 2G) by using a dielectric (or a BF) that may be activated with a light source (e.g., a laser) for a subsequent electroless deposition (e.g., an electroless deposition of NiP).

These embodiments of the package substrate 200 utilize an activated layer that is disposed (or embedded) within a geometrically-defined cavity, which thus enables the formation of a resistor on the activated layer and within the cavity. These embodiments of the package substrate 200 help to precisely control and define the resistance value of the resistor embedded with each cavity. For some embodiments, the package substrate 200 illustrated in FIGS. 2A-2G may be similar to the package substrates 100 and 150 of FIGS. 1A-1B. As such, the one or more components of the package substrate 200 may be similar to the one or more components of the package substrates 100 and 150 of FIGS. 1A-1B as described above. In the illustrated embodiments, the patterning and plating of the build-up layers in the package substrate 200 is shown, however it is to be appreciated that the illustrated features are not limiting and may be formed using different processing operations. Note that well-known features of FIGS. 2A-2G are omitted or simplified in order not to obscure the illustrative implementations.

Referring back to FIG. 2A, the process flow illustrates the package substrate 200 having a dielectric 202. In some embodiments, the dielectric 202 may include (or be doped with) a plurality of metallization particles (or ions) such as, but not limited to, palladium, gold, silver, platinum, and/or ruthenium. For one embodiment, the dielectric 202 may be a catalyst doped dielectric layer (or a catalyst doped BF). For example, the dielectric 202 may include (or be doped with) a plurality of Pd metallization particles (or Pd seeds), which may be used with any electroless deposition process. In this example, the Pd metallization particles may be embedded within the dielectric 202 as the Pd metallization particles may be activated when exposed to a light source (e.g., a laser) or the like.

Figure 2A:
FIGS. 2A-2G are illustrations of cross-sectional views of a process flow to form a package substrate having an embedded resistor in a dielectric that includes a cavity and an activated layer, according to some embodiments.
Figure 2B:
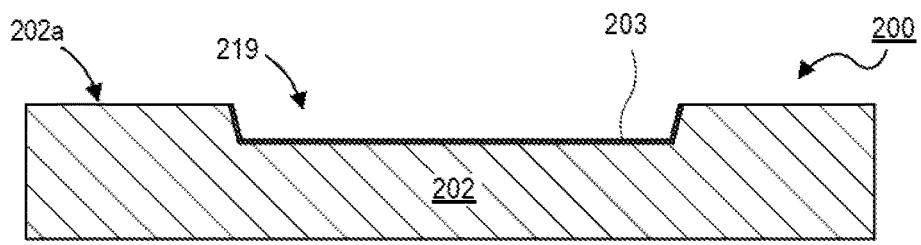

FIG. 2B illustrates patterning the dielectric 202 to form a cavity 219 and activating the dielectric 202 to form an activated layer 203 within the cavity 219. In one embodiment, the dielectric 202 has the activated layer 203 disposed (or embedded) within the cavity 219. For one embodiment, the cavity 219 may be patterned and formed through a top surface 202a of the dielectric 202, where the cavity 219 may include one or more exposed surfaces that are embedded into (or within) the dielectric 202. The exposed surfaces may include a bottom surface and one or more sidewalls that may be tapered. In one embodiment, the cavity 219 may be formed by using a laser ablation process or the like that may pattern (or ablate) the dielectric 202 to form a geometrically-defined cavity having a desired footprint, where the desired footprint may subsequently define a resistive value of the embedded resistor (e.g., as shown in below in FIG. 2C).

Figure 2C:
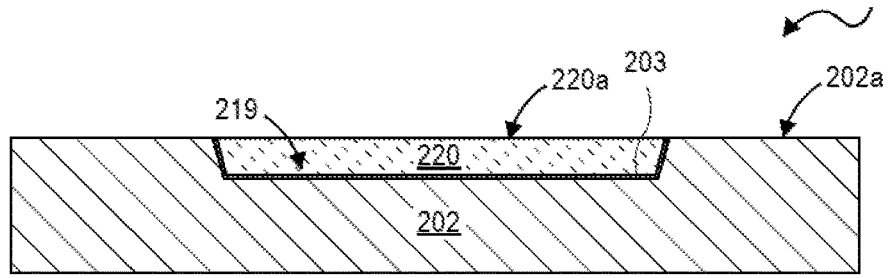

FIG. 2C illustrates disposing (or depositing/forming) a resistive material 220 on the activated layer 203 and within the cavity 219. In one embodiment, the resistive material 220 may be deposited using an electroless deposition process or the like. For example, the resistive material 220 may be NiP which has been electroless deposited onto the activated layer 203 and embedded within the cavity 219. In one embodiment, the activated layer 203 may be formed in the cavity 219 by using a laser light source or the like, and then the resistive material 220 may be selectively plated by using an electroless NiP salt solution or the like. Note that the resistive material 220 is not limited to NiP as the electrolessly deposited resistive material, and may also include the deposition of any resistive material that may be formed using a catalytic electroless process or the like. For example, the subsequently formed resistor may include one or more resistive materials 220 that may be selected from the group consisting of NiP, AlN, TiN, a combination thereof, or the like.

For some embodiments, the resistive material 220 is disposed onto the activated layer 203 in the cavity 219, where the resistive material 220 is embedded within the exposed surfaces of the activated layer 203 (e.g., the exposed surfaces may include the bottom surface and the sidewalls). As such, the resistive material 220 may have an exposed top surface 220a that is approximately on the same plane (or same z-height) as the top surface 202a of the dielectric 202, according to one embodiment.

Figure 2D:
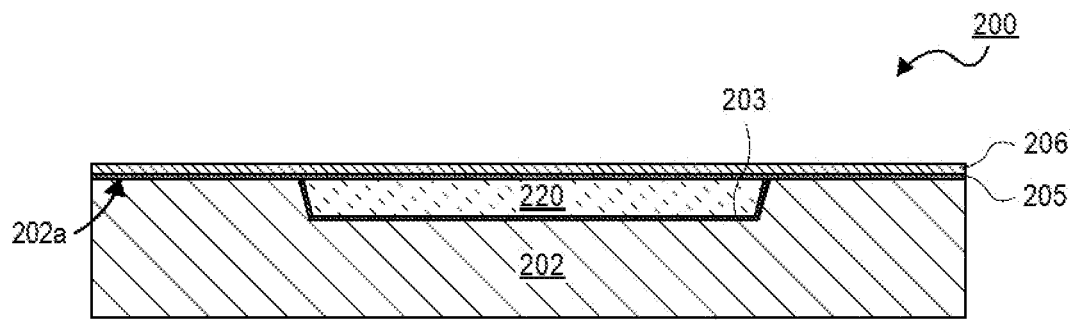

FIG. 2D illustrates disposing a seed layer 205-206 on the top surface 202a of the dielectric 202 and the exposed surface of the resistive material 220. In one embodiment, the seed layer 205-206 may be a Ti/Cu seed layer. For some embodiments, the seed layer 205-206 may include at least both a Ti seed layer 205 disposed on the top surface 202a of the dielectric 202 and the exposed surface of the resistive material 220, and a Cu seed layer 206 disposed on the Ti seed layer 205. For one embodiment, the seed layer 205-206 may be used as (i) an adhesion between the dielectric 202 and the subsequently disposed traces (e.g., the addressing and routing traces 221-222 of FIG. 2G), and (ii) a migration barrier to avoid the diffusion between the resistive material 220 and the subsequent conductive material (e.g., the Cu) of the traces. Note, that in other embodiments, the seed layer may only include a Cu seed layer without having a Ti seed layer.

Figure 2E:
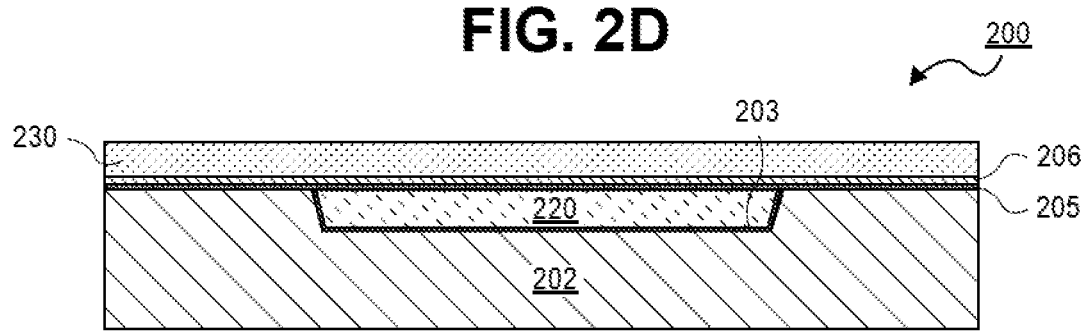

FIG. 2E illustrates disposing a photoresist layer 230 on the seed layer 205-206. In one embodiment, the photoresist layer 230 may be disposed (or laminated) on the seed layer 205-206. For one embodiment, the photoresist layer 230 may be a dry-film photoresist (DFR) having a thickness of approximately 30 μm or less, which enables thinner patterned and plated conductive features (e.g., the addressing and routing traces 221-222 of FIG. 2G). According to an embodiment, the patterning of the photoresist layer 230 may be implemented with a lithographic process (e.g., exposing the photoresist layer 230 with a radiation source through a mask and developed with a developer to subsequently pattern one or more openings 231-232 as shown in FIG. 2F).

Figure 2F:
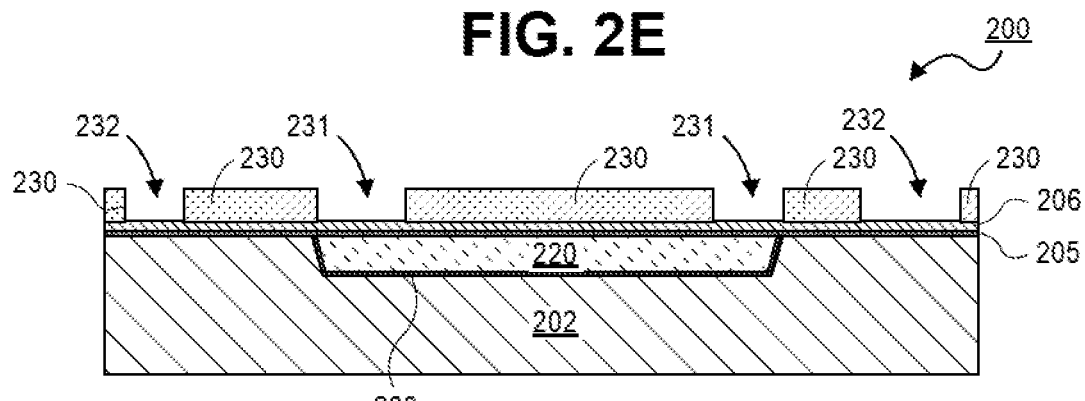

FIG. 2F illustrates patterning the photoresist layer 230 over the seed layer 205-206 to form one or more openings 231-232 that expose one or more surfaces of the seed layer 205-206. In some embodiments, the one or more openings 231-232 may be patterned through the photoresist layer 230 to define the subsequent contacts for the resistor and any other traces. According to one embodiment, the photoresist layer 230 may be patterned to provide the openings 231-232 for the formation of a plurality of traces (e.g., the addressing and routing traces 221-222 of FIG. 2G, respectively). After the photoresist layer 230 has been patterned, traces may be disposed (or plated) on the exposed Cu surfaces of the seed layer 205-206.

Figure 2G:
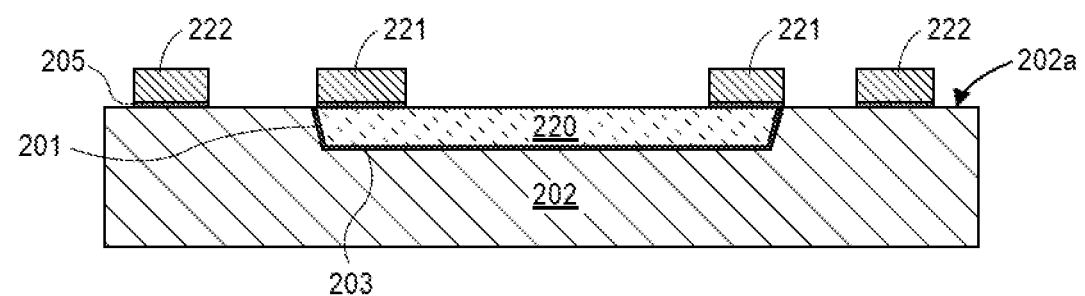

FIG. 2G illustrates flow depositing a conductive material into the openings 231-232 to form a plurality of traces 221 (also referred to as a plurality of addressing traces) over the resistive material 220, and a plurality of routing traces 222 over the dielectric 202. As such, the traces 221 are disposed on the exposed top surface of the resistive material 220 and thus implementing the embedded resistor 201. In one embodiment, the traces 221 may be positioned and located on the outer periphery of the top surface of the resistor 201. Additionally, the package substrate 200 may also include the plurality of routing traces 222 disposed on the top surface 202a of the dielectric 202, where the routing traces 222 may be positioned and located adjacent to the traces 221.

The addressing and routing traces 221-222 may be formed with a conductive material such as Cu or the like. For one embodiment, the addressing and routing traces 221-222 may be formed using an electrolytic plating process or the like. For some embodiments, the addressing and routing traces 221-222 may have a length of approximately between 2 μm to 5000 μm, and a thickness (or depth) of approximately between 5 μm to 100 μm. In alternate embodiments, however, the addressing and routing traces 221-222 may have a length of approximately between 2 μm or less, and a thickness (or depth) of approximately 5 μm or less.

Additionally, FIG. 2G illustrates removing (or striping) the photoresist layer 230 and then etching the exposed seed layer 205-206 which remains after removing the photoresist layer 230. Accordingly, in some embodiments, the package substrate 200 includes the embedded resistor 201 with the addressing and routing traces 221-222 within the same layer (or surface) as the exposed top surface of the embedded resistor 201—where the seed layer 205 acts as a diffusion barrier between the Cu of the traces 221-222 and the NiP resistive material 220 of the resistor 201.

As such, after implementing the process flow as shown in FIGS. 2A-2G, the package substrate 200 may be implemented with the activated layer 203 that is disposed on the one or more surfaces of the cavity 219, the resistor 201 that is embedded within the cavity 219 of the dielectric 202, the traces 221 that are disposed on the resistor 201, and the routing traces 222 that are disposed on the dielectric 202. Additionally, the resistor 201 has a plurality of surfaces and a top surface, and the plurality of surfaces of the resistor 201 are a plurality of activated surfaces. The resistor 201 may also include a plurality of activated sidewalls, where the plurality of sidewalls are tapered. The dielectric 202 may include a plurality of metallization particles. The cavity 219 may have a footprint, where a resistance value of the resistor 201 may be based on the footprint of the cavity 219.

Note that the package substrate 200 as shown in FIGS. 2A-2G may include fewer or additional packaging components based on the desired packaging design.

FIGS. 3A-3F are illustrations of cross-sectional views of a process flow to form an embedded resistor in a package substrate 300 having two or more stacked dielectrics, according to some embodiments. These embodiments as shown with respect to FIGS. 3A-3F provide the process flow that combines a patterning process and an electroless plating process to form one or more embedded resistors in two or more stacked dielectrics that have been patterned with one or more cavities, where the cavities include an activated layer disposed thereof. The process flow illustrated with FIGS. 3A-3F implements the formation of thin-embedded resistors (e.g., the resistor 301 of FIG. 3F) by using a dielectric (or a BF) that may be activated with a light source (e.g., a laser) for a subsequent electroless deposition (e.g., an electroless deposition of NiP).

These embodiments of the package substrate 300 utilize an activated layer that is disposed (or embedded) within a geometrically-defined cavity, which thus enables the formation of a resistor on the activated layer and within the cavity. These embodiments of the package substrate 300 help to precisely control and define the resistance value of the resistor embedded with each cavity. For some embodiments, the package substrate 300 illustrated in FIGS. 3A-3F may be similar to the package substrates 100 and 150 of FIGS. 1A-1B and the package substrate 200 of FIGS. 2A-2G, however the package substrate 300 includes two stacked dielectrics with vias (also referred to as addressing vias). Accordingly, the package substrate 300 includes the embedded resistor and vias/pads (or addressing vias/pad) on two separate dielectric layers (e.g., as shown in FIG. 3F), which enables a better process window as the resistive material may not be impacted by any wet chemistry. As such, the one or more components of the package substrate 300 may be similar to the one or more components of the package substrates 100 and 150 of FIGS. 1A-1B and the package substrate 200 of FIGS. 2A-2G as described above. In the illustrated embodiments, the patterning and plating of the build-up layers in the package substrate 300 is shown, however it is to be appreciated that the illustrated features are not limiting and may be formed using different processing operations. Note that well-known features of FIGS. 3A-3F are omitted or simplified in order not to obscure the illustrative implementations.

Referring back to FIG. 3A, the process flow illustrates the package substrate 300 having a dielectric 302. In some embodiments, the dielectric 302 may include (or be doped with) a plurality of metallization particles (or ions) such as, but not limited to, palladium, gold, silver, platinum, and/or ruthenium. For one embodiment, the dielectric 302 may be a catalyst doped dielectric layer (or a catalyst doped BF). For example, the dielectric 302 may include (or be doped with) a plurality of Pd metallization particles (or Pd seeds), which may be used with any electroless deposition process. In this example, the Pd metallization particles may be embedded within the dielectric 302 as the Pd metallization particles may be activated when exposed to a light source (e.g., a laser) or the like.

Figure 3A:
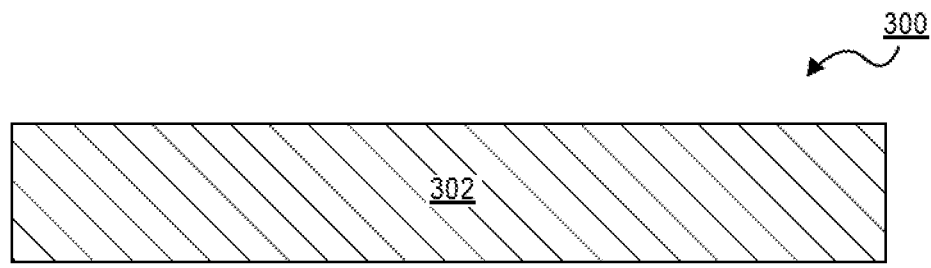
FIGS. 3A-3F are illustrations of cross-sectional views of a process flow to form a package substrate having an embedded resistor in one or more stacked dielectrics, where one dielectric includes a cavity and an activated layer, according to some embodiments.
Figure 3B:
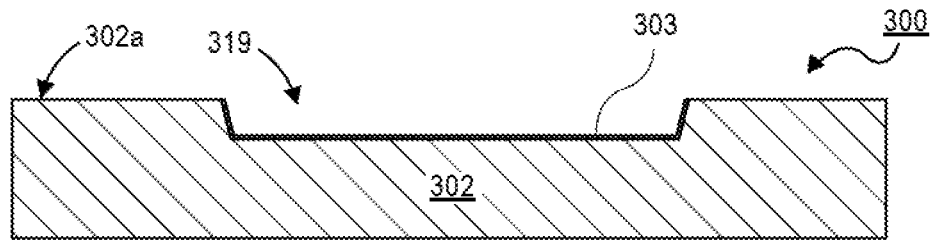

FIG. 3B illustrates patterning the dielectric 302 to form a cavity 319 and activating the dielectric 302 to form an activated layer 303 within the cavity 319. In one embodiment, the dielectric 302 has the activated layer 303 disposed (or embedded) within the cavity 319. For one embodiment, the cavity 319 may be patterned and formed through a top surface 302a of the dielectric 302, where the cavity 319 may include one or more exposed surfaces that are embedded into (or within) the dielectric 302. The exposed surfaces may include a bottom surface and one or more sidewalls that may be tapered. In one embodiment, the cavity 319 may be formed by using a laser ablation process or the like that may pattern (or ablate) the dielectric 302 to form a geometrically-defined cavity having a desired footprint, where the desired footprint may subsequently define a resistive value of the embedded resistor (e.g., as shown in below in FIG. 3C).

Figure 3C:
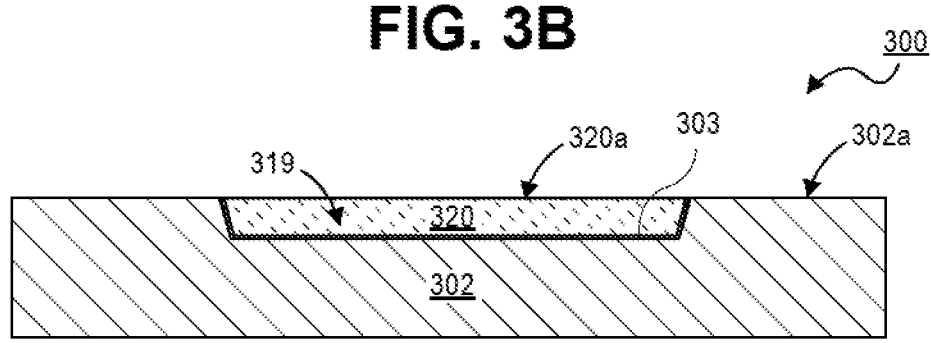

FIG. 3C illustrates disposing (or depositing/forming) a resistive material 320 on the activated layer 303 and within the cavity 319. In one embodiment, the resistive material 320 may be deposited using an electroless deposition process or the like. For example, the resistive material 320 may be NiP which has been electroless deposited onto the activated layer 303 and embedded within the cavity 319. In one embodiment, the activated layer 303 may be formed in the cavity 319 by using a laser light source or the like, and then the resistive material 320 may be selectively plated by using an electroless NiP salt solution or the like. Note that the resistive material 320 is not limited to NiP as the electrolessly deposited resistive material, and may also include the deposition of any resistive material that may be formed using a catalytic electroless process or the like. For example, the subsequently formed resistor may include one or more resistive materials 320 that may be selected from the group consisting of NiP, AlN, TiN, a combination thereof, or the like.

For some embodiments, the resistive material 320 is disposed onto the activated layer 303 in the cavity 319, where the resistive material 320 is embedded within the exposed surfaces of the activated layer 303 (e.g., the exposed surfaces may include the bottom surface and the sidewalls). As such, the resistive material 320 may have an exposed top surface that is approximately on the same plane (or same z-height) as the top surface 302a of the dielectric 302, according to one embodiment.

Figure 3D:
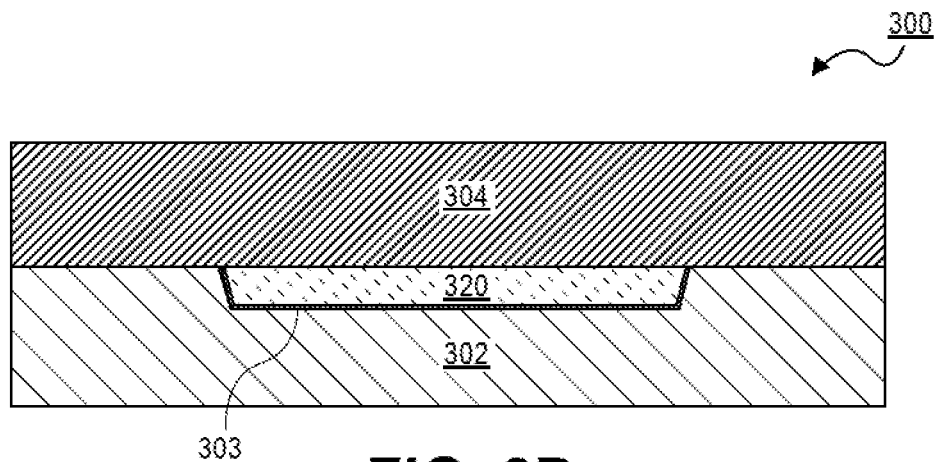

FIG. 3D illustrates disposing a second dielectric 304 on the dielectric 302 and the resistive material 320. By way of example, the dielectrics 302 and 304 may be a polymer material such as, for example, polyimide, epoxy, or BF. For one embodiment, the dielectrics 302 and 304 may be an ABF. In an embodiment, the dielectrics 302 and 304 may be one layer in a stack that includes a plurality of additional dielectric layers used to form a build-up structure.

Figure 3E:
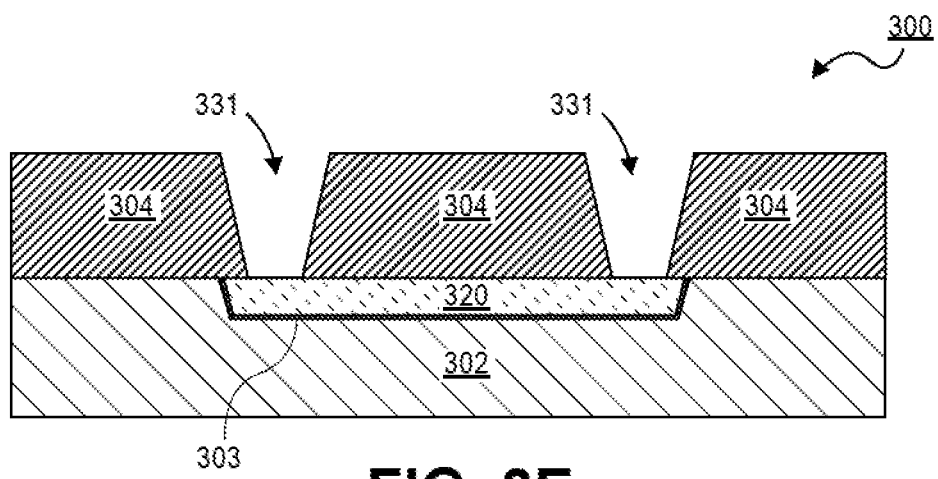
Figure 3F:
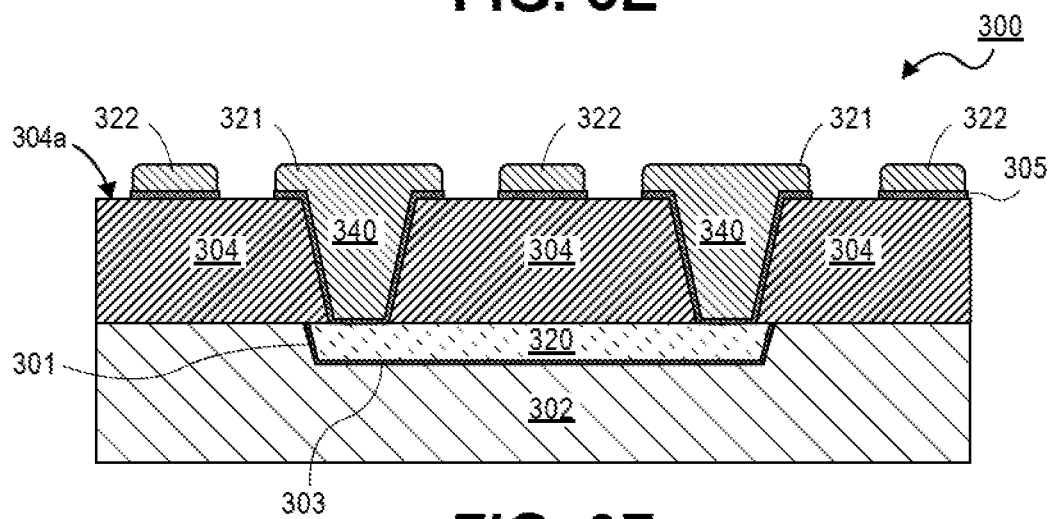

FIG. 3E illustrates patterning the second dielectric 304 to form one or more openings 331 that expose one or more top surfaces of the resistive material 320. In one embodiment, the openings 331 may be formed by using a laser ablation process or the like that may pattern (or ablate) the second dielectric 304.

FIG. 3F illustrates disposing a conductive material to form a plurality of vias 340, a plurality of via pads 321 (also referred to as a plurality of addressing via pads), and a plurality of routing traces 322, where each of the via pads and routing traces 321-322 and the vias 340 are disposed on a seed layer 305. In one embodiment, the seed layer 305 may be a Ti/Cu seed layer. For some embodiments, the seed layer 305 may be disposed on a top surface 304a of the dielectric 304 and the aforementioned, exposed surfaces of the resistive material 320. For one embodiment, the seed layer 305 may be used as (i) an adhesion between the dielectric 304 and the via pads and routing traces 321-322 and the vias 340, and (ii) a migration barrier to avoid the diffusion between the resistive material 320 and the conductive material of the vias 340. Note, that in other embodiments, the seed layer may only include a Cu seed layer without having a Ti seed layer.

Note that, as described above in FIGS. 2E-2F, the package substrate 300 may be implemented by a process flow which may include disposing and patterning a photoresist layer used for forming the vias 340 and the via pads and routing traces 321-322. In one embodiment, as shown in FIG. 3F, the vias 340 are disposed on (and coupled to) one or more surfaces of the resistive material 320 and thus implementing the embedded resistor 301. In one embodiment, the vias 340 may be positioned and located on the outer periphery of the top surface of the resistor 301. Additionally, the package substrate 300 may also include the plurality of routing traces 322 disposed on the top surface 304a of the dielectric 304, where the routing traces 322 may be positioned and located adjacent to the via pads 321.

The via pads and routing traces 321-322 and the vias 340 may be formed with a conductive material such as Cu or the like. For one embodiment, the via pads and routing traces 321-322 and the vias 340 may be formed using an electrolytic plating process or the like. For some embodiments, the vias 340 may have a depth (or thickness) of approximately between 5 μm to 5000 μm, and the via pads 321 may have a diameter of approximately between 5 μm to 50 μm. In alternate embodiments, however, the vias 340 and via pads 321 may have a depth and a diameter, respectively, of approximately between 5 μm or less.

Accordingly, after implementing the process flow as shown in FIGS. 3A-3F, the package substrate 300 may be implemented with the activated layer 303 that is disposed on the one or more surfaces of the cavity 319, the resistor 301 that is embedded within the cavity 319 of the dielectric 302, the first dielectric 304 that is disposed on the dielectric 302 and the resistor 301, the via pads 321 and vias 340 that are disposed on the resistor 301, and the routing traces 322 that are disposed on the first dielectric 304. Additionally, the resistor 301 has a plurality of surfaces and a top surface, and the plurality of surfaces of the resistor 301 are a plurality of activated surfaces. The resistor 301 may also include a plurality of activated sidewalls, where the plurality of sidewalls are tapered. The dielectric 302 may include a plurality of metallization particles. The cavity 319 may have a footprint, where a resistance value of the resistor 301 may be based on the footprint of the cavity 319.

Note that package substrate 300 as shown in FIGS. 3A-3F may include fewer or additional packaging components based on the desired packaging design.

FIG. 4 illustrates a semiconductor package 400 including a die 414, a substrate 412 (or an interposer), interconnect structures (e.g., the plurality of bumps disposed below the die 414 and the substrate 412), and the package substrate 402, where the substrate 412 and/or the package substrate 402 may have build-up structures with one or more embedded resistors in a dielectric that includes one or more cavities and one or more activated layers, according to some embodiments.

For one embodiment, the semiconductor package 400 may implement the substrate 412 and/or the package substrate 402 to include a build-up structure 450 (as the build-up structure may be similar to the package substrates described herein) having an embedded resistor in a dielectric that includes a cavity and an activated layer, according to one embodiment. For another embodiment, the build-up structure 450 may include one or more embedded resistors having different footprints in a dielectric that includes one or more cavities and one or more activated layers. In some embodiments, the build-up structure 450 may include an embedded resistor in two or more stacked dielectrics, where one of the dielectrics may include a cavity and an activated layer.

For one embodiment, the build-up structure(s) 450 of the substrate 412 and/or the package substrate 402 may be similar to the package substrates of FIGS. 1-3. Note that the semiconductor package 400 is not limited to the illustrated semiconductor packaged system, and thus may be designed/formed with fewer, alternate, or additional packaging components and/or with different interconnecting structures. In some embodiments, the build-up structure(s) 450 may be implemented with an activated layer that is disposed on one or more surfaces of a cavity, a resistor that is embedded within the cavity of a dielectric, a plurality of traces (or addressing traces) that are disposed on the resistor, and a plurality of routing traces that are disposed on the dielectric. Additionally, the resistor may have a plurality of surfaces and a top surface, and the plurality of surfaces of the resistor are a plurality of activated surfaces. The resistor may also include a plurality of activated sidewalls, where the plurality of sidewalls are tapered. The dielectric may include a plurality of metallization particles. The cavity (or cavities) may have a footprint, where a resistance value of the resistor may be based on the footprint of the cavity.

These build-up structures 450 enable the semiconductor package 400 to have improved electrical performances such as increased functionality and minimized need for passive components (e.g., as shown in FIGS. 1-3). Note that the package substrate 402 and/or the substrate 412 may be similar to the package substrates of FIGS. 1-3.

According to one embodiment, the semiconductor package 400 is merely one example of an embodiment of a semiconductor packaged system. For one embodiment, the semiconductor package 400 may include a land grid array (LGA) package and/or a pin grid array (PGA) package. For one embodiment, a die 414 (or an integrated circuit die) is coupled to a substrate 412 (e.g., an interposer) via one or more bumps/joints formed from respective microbumps. As described above, a solder joint formed by soldering of a microbump according to an embodiment may itself be referred to as a "bump" and/or a "microbump." Additionally, for other embodiments, the die 414, the substrate 412, and the package substrate 402 may be coupled using anisotropic conductive film (ACF). For one embodiment, the substrate 412 may be, but is not limited to, a silicon interposer and/or a die with through silicon vias (TSVs). For an alternate embodiment, the semiconductor package 400 may omit the interposer/substrate 412.

For some embodiments, the semiconductor package 400 may have the die 414 disposed on the interposer 412, where both the stacked die 414 and interposer 412 are disposed on a package substrate 402. According to some embodiments, the package substrate 402 may include, but is not limited to, a package, a substrate, a PCB, and a motherboard. For one embodiment, the package substrate 402 is a PCB. For one embodiment, the PCB is made of an FR-4 glass epoxy base with thin copper foil laminated on both sides. For certain embodiments, a multilayer PCB can be used, with pre-preg and copper foil used to make additional layers. For example, the multilayer PCB may include one or more dielectric layers, where each dielectric layer can be a photosensitive dielectric layer. For some embodiments, holes may be drilled in the PCB 402. For one embodiment, the PCB 402 may also include conductive layers that comprise copper lines/traces, metallic pads, vias, via pads, planes, and/or holes.

For one embodiment, the die 414 may include, but is not limited to, a semiconductor die, an electronic device (e.g., a wireless device), an integrated circuit, a central processing unit (CPU), a microprocessor, a platform controller hub (PCH), a memory, and a field-programmable gate array (FPGA). The die 414 may be formed from a material such as silicon and have circuitry thereon that is to be coupled to the interposer 412. Although some embodiments are not limited in this regard, the package substrate 402 may in turn be coupled to another body, for example, a computer motherboard. One or more connections between the package substrate 402, the interposer 412, and the die 414—e.g., including some or all of bumps 416, 418, and 420—may include one or more interconnect structures and underfill layers 426 and 428. In some embodiments, these interconnect structures (or connections) may variously comprise an alloy of nickel, palladium, and tin (and, in some embodiments, Cu).

Connections between the package substrate 402 and another body may be made using any suitable structure, such as the illustrative bumps 420 shown. The package substrate 402 may include a variety of electronic structures formed thereon or therein. The interposer 412 may also include electronic structures formed thereon or therein, which may be used to couple the die 414 to the package substrate 402. For one embodiment, one or more different materials may be used for forming the package substrate 402 and the interposer 412. In certain embodiments, the package substrate 402 is an organic substrate made up of one or more layers of polymer base material, with conducting regions for transmitting signals. In certain embodiments, the interposer 412 is made up of a ceramic base material including metal regions for transmitting signals. Although some embodiments are not limited in this regard, the semiconductor package 400 may include gap control structures 430—e.g., positioned between the package substrate 402 and the interposer 412. Such gap control structures 430 may mitigate a change in the height of the gap between the package substrate 402 and the interposer 412, which otherwise might occur during reflowing while die 414 is attached to interposer 412. Note that the semiconductor package 400 includes an underfill material 428 between the interposer 412 and the die 414, and an underflow material 426 between the package substrate 402 and the interposer 412. For one embodiment, the underfill materials (or layers) 426 and 428 may be one or more polymers that are injected between the layers. For other embodiments, the underfill materials may be molded underfills (MUF).

Note that the semiconductor package 400 may include fewer or additional packaging components based on the desired packaging design.

Figure 5:
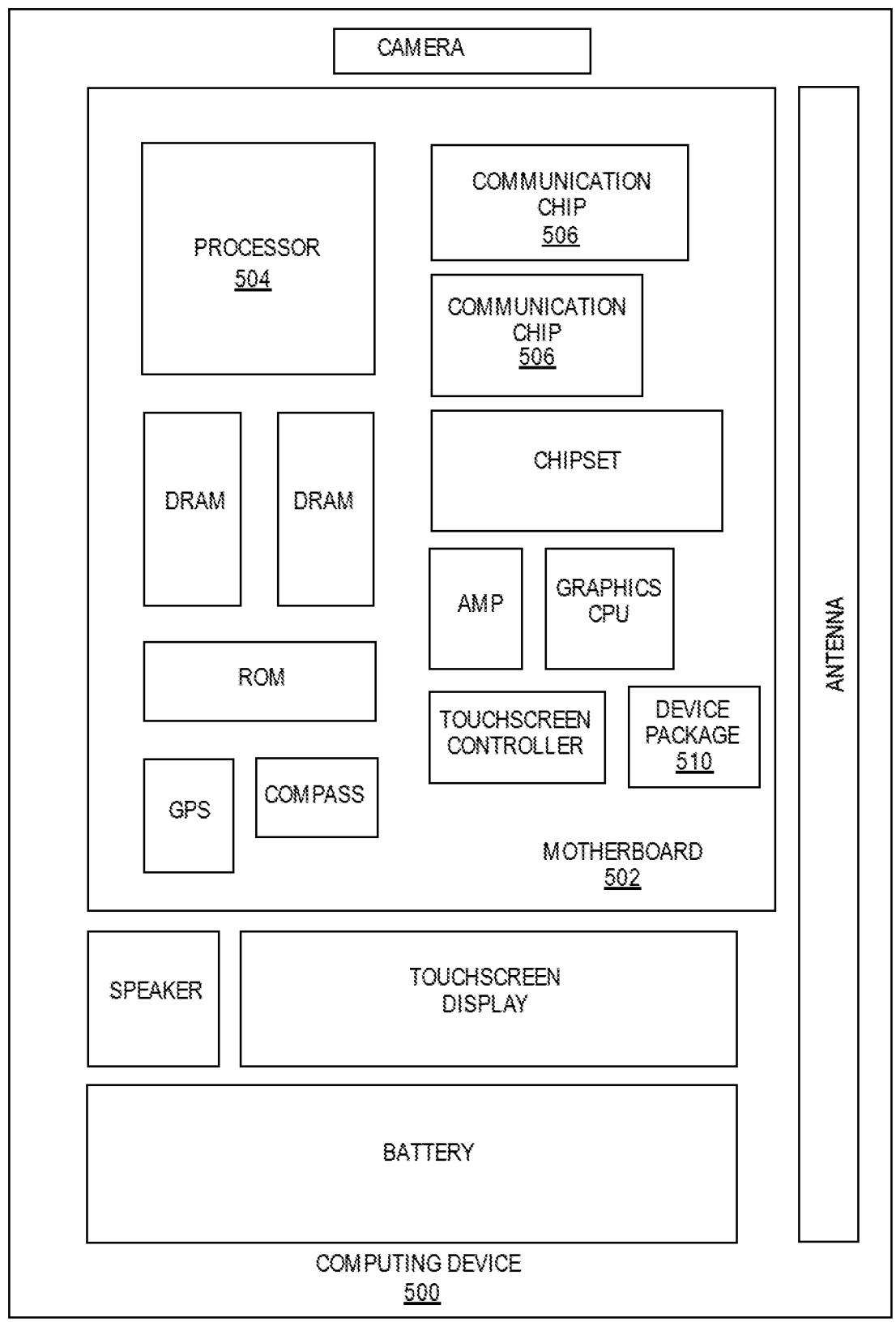
FIG. 5 is an illustration of a schematic block diagram illustrating a computer system that utilizes a package substrate having an embedded resistor in a dielectric that includes a cavity and an activated layer, according to one embodiment.

FIG. 5 is a schematic block diagram illustrating a computer system 500 that utilizes a package substrate having an embedded resistor in a dielectric that includes a cavity and an activated layer, where the resistor may have a resistance value based on a defined footprint of the cavity, according to one embodiment. FIG. 5 illustrates an example of computing device 500. Computing device 500 houses motherboard 502. For one embodiment, motherboard 502 may be similar to the substrate of FIG. 4 (e.g., the substrate 402 of FIG. 4). Motherboard 502 may include a number of components, including but not limited to processor 504, device package 510 (or semiconductor package), and at least one communication chip 506. Processor 504 is physically and electrically coupled to motherboard 502. For some embodiments, at least one communication chip 506 is also physically and electrically coupled to motherboard 502. For other embodiments, at least one communication chip 506 is part of processor 504.

Depending on its applications, computing device 500 may include other components that may or may not be physically and electrically coupled to motherboard 502. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

At least one communication chip 506 enables wireless communications for the transfer of data to and from computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. At least one communication chip 506 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 500 may include a plurality of communication chips 506. For instance, a first communication chip 506 may be dedicated to shorter range wireless communications such as Wi-Fi and Bluetooth and a second communication chip 506 may be dedicated to longer range wireless communications such as GPS, EDGE, GPRS, CDMA, WiMAX, LTE, Ev-DO, and others.

Processor 504 of computing device 500 includes an integrated circuit die packaged within processor 504. Device package 510 may be, but is not limited to, a substrate, a packaging substrate, and/or a PCB. Device package 510 may include an embedded resistor in a dielectric that includes a cavity and an activated layer, where the resistor may have a resistance value based on a defined footprint of the cavity (as illustrated in FIGS. 1-3)—or any other components from the figures described herein—of the computing device 500. The device package 510 may thus provide increased functionalities and increased electrical performances (e.g., as compared to existing solutions).

Note that device package 510 may be a single component/device, a subset of components, and/or an entire system, as the materials, features, and components may be limited to device package 510 and/or any other component of the computing device 500 that may need a defined, embedded resistor having an activated layer thereof (e.g., the motherboard 502, the processor 504, and/or any other component of the computing device 500 may need package structures as described herein).

For certain embodiments, the integrated circuit die may be packaged with one or more devices on a package substrate that includes a thermally stable RFIC and antenna for use with wireless communications and the device package, as described herein, to reduce the z-height of the computing device. The term "processor" may refer to any device or portion of a device that processes electronic data from registers and/or memory to transform that electronic data into other electronic data that may be stored in registers and/or memory.

At least one communication chip 506 also includes an integrated circuit die packaged within the communication chip 506. For some embodiments, the integrated circuit die of the communication chip may be packaged with one or more devices on a package substrate that includes one or more device packages, as described herein.

In the foregoing specification, embodiments have been described with reference to specific exemplary embodiments thereof. It should be borne in mind, however, that all of these and similar terms are to be associated with the appropriate physical quantities and are merely convenient labels applied to these quantities. It will be evident that various modifications may be made thereto without departing from the broader spirit and scope. The specification and drawings are, accordingly, to be regarded in an illustrative sense rather than a restrictive sense.

The following examples pertain to further embodiments. The various features of the different embodiments may be variously combined with some features included and others excluded to suit a variety of different applications.

The following examples pertain to further embodiments:

Example 1 is a package substrate, comprising of a dielectric having a cavity, where the cavity has a footprint; a resistor embedded in the cavity of the dielectric, where the resistor has a plurality of surfaces and a top surface; and a plurality of addressing traces on the resistor, where the plurality of surfaces of the resistor are a plurality of activated surfaces.

In example 2, the subject matter of example 1 can optionally include that the resistor has a plurality of sidewalls.

In example 3, the subject matter of example 1-2 can optionally include that the plurality of sidewalls of the resistor are a plurality of activated sidewalls.

In example 4, the subject matter of any of examples 1-3 can optionally include that the plurality of sidewalls are tapered.

In example 5, the subject matter of any of examples 1-4 can optionally include that the dielectric includes at least one of a plurality of metallization particles and a plurality of metallization ions. The resistor includes one or more resistive materials. The one or more resistive materials include nickel-phosphorus (NiP), aluminum-nitride (AlN), and titanium-nitride (TiN).

In example 6, the subject matter of any of examples 1-5 can optionally include that a plurality of routing traces are on the dielectric. The plurality of routing traces are adjacent to the plurality of addressing traces. A first resistor is embedded in a first cavity of the dielectric. The first resistor has a plurality of first surfaces and a top first surface. A plurality of first addressing traces are on the first resistor. The plurality of first surfaces of the first resistor are a plurality of first activated surfaces. The first cavity has a first footprint. The first footprint of the first cavity is different than the footprint of the cavity. A resistance value of the resistor is thus different than a first resistance value of the first resistor.

In example 7, the subject matter of any of examples 1-6 can optionally include that the plurality of addressing traces are located on the top surface of the resistor. The plurality of addressing traces are located on the outer periphery of the top surface of the resistor.

In example 8, the subject matter of any of examples 1-7 can optionally include a seed layer disposed between the plurality of addressing traces and the top surface of the resistor. The seed layer is disposed between the plurality of routing traces and the dielectric.

Example 9 is a method of forming a package substrate, comprising disposing a dielectric having a cavity, wherein the cavity has a footprint; disposing a resistor embedded in the cavity of the dielectric, wherein the resistor has a plurality of surfaces and a top surface; and disposing a plurality of addressing traces on the resistor, wherein the plurality of surfaces of the resistor are a plurality of activated surfaces.

In example 10, the subject matter of example 9 can optionally include that the resistor has a plurality of sidewalls. The plurality of sidewalls of the resistor are a plurality of activated sidewalls. The plurality of sidewalls are tapered.

In example 11, the subject matter of example 9-10 can optionally include that the dielectric includes at least one of a plurality of metallization particles and a plurality of metallization ions.

In example 12, the subject matter of example 9-11 can optionally include disposing a plurality of routing traces on the dielectric, where the plurality of routing traces are adjacent to the plurality of addressing traces; disposing a first resistor embedded in a first cavity of the dielectric, where the first resistor has a plurality of first surfaces and a top first surface; and disposing a plurality of first addressing traces on the first resistor. The plurality of first surfaces of the first resistor are a plurality of first activated surfaces. The first cavity has a first footprint. The first footprint of the first cavity is different than the footprint of the cavity. A resistance value of the resistor is thus different than a first resistance value of the first resistor.

In example 13, the subject matter of example 9-12 can optionally, when disposing the resistor embedded in the cavity of the dielectric, further include patterning the dielectric to form the cavity and activating the dielectric to form the activated surfaces within the cavity, where the activated surfaces are disposed within the cavity; disposing one or more resistive materials on the activated surfaces and within the cavity to form the resistor, where the one or more resistive materials include NiP, AlN, and TiN; disposing a seed layer on the top surface of the dielectric and an exposed surface of the resistive material, where the seed layer includes a titanium-copper seed layer; disposing a photoresist layer on the seed layer; and patterning the photoresist layer over the seed layer to form one or more openings that expose one or more surfaces of the seed layer.

In example 14, the subject matter of example 9-13 can optionally, when disposing the plurality of addressing traces on the resistor, further include disposing a conductive material into the openings to form the plurality of addressing traces on the resistive material, and a plurality of routing traces on the dielectric; removing the photoresist layer to expose the seed layer; and etching the exposed seed layer.

In example 15, the subject matter of example 9-14 can optionally include that the plurality of addressing traces are located on the top surface of the resistor. The plurality of addressing traces are located on the outer periphery of the top surface of the resistor.

In example 16, the subject matter of example 9-15 can optionally include disposing a seed layer between the plurality of addressing traces and the top surface of the resistor. The seed layer is disposed between the plurality of routing traces and the dielectric.

Example 17 is a package substrate, comprising a first dielectric having a cavity, wherein the cavity has a footprint; a resistor embedded in the cavity of the first dielectric, wherein the resistor has a plurality of surfaces and a top surface; a second dielectric on the first dielectric and the resistor; and a plurality of addressing vias and a plurality of addressing via pads on the resistor, wherein the addressing vias couple the resistor to the addressing via pads, and wherein the plurality of surfaces of the resistor are a plurality of activated surfaces.

In example 18, the subject matter of example 17 can optionally include that the resistor has a plurality of sidewalls.

In example 19, the subject matter of example 17-18 can optionally include that the plurality of sidewalls of the resistor are a plurality of activated sidewalls.

In example 20, the subject matter of example 17-19 can optionally include that the plurality of sidewalls are tapered.

In example 21, the subject matter of example 17-20 can optionally include that the first dielectric includes a plurality of metallization particles.

In example 22, the subject matter of example 17-21 can optionally include a plurality of routing traces on the second dielectric, where the plurality of routing traces are adjacent to the plurality of addressing via pads; a first resistor embedded in a first cavity of the first dielectric, where the first resistor has a plurality of first surfaces and a top first surface; and a plurality of first addressing vias and a plurality of first addressing via pads on the first resistor. The first addressing vias couple the first resistor to the first addressing via pads. The plurality of first surfaces of the first resistor are a plurality of first activated surfaces. The first cavity has a first footprint. The first footprint of the first cavity is different than the footprint of the cavity. A resistance value of the resistor is thus different than a first resistance value of the first resistor.

In example 23, the subject matter of example 17-22 can optionally include that the plurality of addressing vias are located on the top surface of the resistor. The plurality of addressing vias are located on the outer periphery of the top surface of the resistor.

In example 24, the subject matter of example 17-23 can optionally include a seed layer disposed under the plurality of addressing vias, the plurality of addressing via pads, and the routing traces. The seed layer is disposed on one or more top surfaces of the resistor.

In example 25, the subject matter of example 17-24 can optionally include that the first dielectric includes at least one of a plurality of metallization particles and a plurality of metallization ions. The resistor includes one or more resistive materials. The one or more resistive materials include NiP, AlN, and TiN.

In the foregoing specification, methods and apparatuses have been described with reference to specific exemplary embodiments thereof. It will be evident that various modifications may be made thereto without departing from the broader spirit and scope. The specification and drawings are, accordingly, to be regarded in an illustrative sense rather than a restrictive sense.

What is claimed is:

1. A package substrate, comprising:
    a dielectric having a first cavity and a second cavity, wherein the first cavity has a first footprint and the second cavity has a second footprint different than the first footprint;
    a first resistor embedded in the first cavity of the dielectric and a second resistor embedded in the second cavity of the dielectric, wherein each of the first resistor and the second resistor has a plurality of surfaces and a top surface, and wherein a resistance value of the first resistor is different than a resistance value of the second resistor;
    a plurality of first traces on the top surface of the first resistor and a plurality of second traces on the top surface of the second resistor, wherein the plurality of surfaces of the first resistor and the second resistor are a plurality of activated surfaces; and
    a plurality of routing traces on the dielectric, wherein the plurality of routing traces are adjacent to the plurality of first traces and the plurality of second traces.

2. The package substrate of claim 1, wherein each of the first resistor and the second resistor has a plurality of sidewalls.

3. The package substrate of claim 2, wherein the plurality of sidewalls of each of the first resistor and the second resistor are a plurality of activated sidewalls.

4. The package substrate of claim 2, wherein the plurality of sidewalls are tapered.

5. The package substrate of claim 1, wherein the dielectric includes at least one of a plurality of metallization particles and a plurality of metallization ions, wherein each of the first resistor and the second resistor includes one or more resistive materials, and wherein the one or more resistive materials is selected from the group consisting of nickel-phosphorus (NiP), aluminum-nitride (AlN), or titanium-nitride (TiN).

6. The package substrate of claim 1, wherein the plurality of traces are located on the outer periphery of the top surface of the first resistor and the second resistor.

7. The package substrate of claim 1, further comprising a seed layer disposed between the plurality of first traces and the top surface of the first resistor and between the plurality of second traces and the top surface of the second resistor, and the seed layer is disposed between the plurality of routing traces and the dielectric.

8. A method of forming a package substrate, comprising:
   forming a dielectric having a first cavity and a second cavity, wherein the first cavity has a first footprint and the second cavity has a second footprint different than the first footprint;
   forming a first resistor embedded in the first cavity of the dielectric and a second resistor embedded in the second cavity of the dielectric, wherein each of the first resistor and the second resistor has a plurality of surfaces and a top surface, and wherein a resistance value of the first resistor is different than a resistance value of the second resistor;
   forming a plurality of first traces on the top surface of the first resistor and a plurality of second traces on the top surface of the second resistor, wherein the plurality of surfaces of the first resistor and the second resistor are a plurality of activated surfaces; and
   forming a plurality of routing traces on the dielectric, wherein the plurality of routing traces are adjacent to the plurality of first traces and the plurality of second traces.

9. The method of claim 8, wherein each of the first resistor and the second resistor has a plurality of sidewalls, wherein the plurality of sidewalls of each of the first resistor and the second resistor are a plurality of activated sidewalls, and wherein the plurality of sidewalls are tapered.

10. The method of claim 8, wherein the dielectric includes at least one of a plurality of metallization particles and a plurality of metallization ions.

11. The method of claim 8, wherein forming the first resistor in the first cavity of the dielectric and forming the second resistor in the second cavity of the dielectric, further includes:
   patterning the dielectric to form the first cavity and the second cavity and activating the dielectric to form the activated surfaces within the first cavity and the second cavity, wherein the activated surfaces are disposed within the first cavity and the second cavity;
   disposing one or more resistive materials on the activated surfaces and within the first cavity and the second cavity to form the first resistor and the second cavity resistor, wherein the one or more resistive materials is selected from the group consisting NiP, AlN, or TiN;
   disposing a seed layer on the top surface of the dielectric and an exposed surface of the resistive material, wherein the seed layer includes a titanium-copper seed layer;
   disposing a photoresist layer on the seed layer; and
   patterning the photoresist layer over the seed layer to form one or more openings that expose one or more surfaces of the seed layer.

12. The method of claim 11, wherein forming the plurality of first traces on the first resistor and forming the plurality of second traces on the second resistor, further includes:
   disposing a conductive material into the openings to form the plurality of first traces and the plurality of second traces on the resistive material, and the plurality of routing traces on the dielectric;
   removing the photoresist layer to expose the seed layer; and
   etching the exposed seed layer.

13. The method of claim 8, wherein the plurality of traces are located on the outer periphery of the top surface of the first resistor and the second resistor.

14. The method of claim 8, further comprising:
   disposing a seed layer between the plurality of first traces and the top surface of the first resistor and between the plurality of second traces and the top surface of the second resistor; and
   disposing the seed layer between the plurality of routing traces and the dielectric.

15. A package substrate, comprising:
   a dielectric having a cavity, wherein the cavity has a footprint;
   a resistor embedded in the cavity of the dielectric, wherein the resistor has a plurality of surfaces and a top surface;
   a plurality of traces on the resistor, wherein the plurality of surfaces of the resistor are a plurality of activated surfaces;
   a plurality of routing traces on the dielectric, wherein the plurality of routing traces are adjacent to the plurality of traces;
   a first resistor embedded in a first cavity of the dielectric, wherein the first resistor has a plurality of first surfaces and a top first surface; and
   a plurality of first traces on the first resistor, wherein the plurality of first surfaces of the first resistor are a plurality of first activated surfaces, wherein the first cavity has a first footprint, wherein the first footprint of the first cavity is different than the footprint of the cavity, and wherein a resistance value of the resistor is thus different than a first resistance value of the first resistor.

* * * * *